(12) United States Patent
Bosley et al.

(10) Patent No.: US 7,016,822 B2
(45) Date of Patent: Mar. 21, 2006

(54) METHOD AND SYSTEM FOR MODELING NEAR END CROSSTALK IN A BINDER GROUP

(75) Inventors: David L. Bosley, Boulder, CO (US); James R. Koehler, Boulder, CO (US)

(73) Assignee: Qwest Communications International, Inc., Denver, CO (US)

( * ) Notice: Subject to any disclaimer, the term of this patent is extended or adjusted under 35 U.S.C. 154(b) by 670 days.

(21) Appl. No.: 09/895,485

(22) Filed: Jun. 29, 2001

(65) Prior Publication Data

US 2002/0138811 A1    Sep. 26, 2002

Related U.S. Application Data

(60) Provisional application No. 60/215,493, filed on Jun. 30, 2000.

(51) Int. Cl.
*G06F 17/10*    (2006.01)

(52) U.S. Cl. ............... 703/2; 379/417; 702/194; 375/222; 375/257

(58) Field of Classification Search .......... 703/2; 702/194, 69; 379/417; 375/222, 225, 260, 375/257; 264/1.24; 324/533, 76.1, 76.21, 324/76.22; 370/201, 480
See application file for complete search history.

(56) References Cited

U.S. PATENT DOCUMENTS

| | | | | |
|---|---|---|---|---|
| 4,344,142 A | | 8/1982 | Diehr, II et al. ............ 364/473 |
| 5,479,447 A | * | 12/1995 | Chow et al. ................ 375/260 |
| 5,673,290 A | * | 9/1997 | Cioffi ......................... 375/260 |
| 5,970,088 A | * | 10/1999 | Chen ........................... 375/222 |
| 6,028,989 A | * | 2/2000 | Dansky et al. ................ 716/8 |
| 6,088,368 A | * | 7/2000 | Rubinstain et al. ......... 370/480 |
| 6,241,920 B1 | * | 6/2001 | Cotter et al. .............. 264/1.24 |
| 6,285,653 B1 | * | 9/2001 | Koeman et al. ............ 370/201 |
| 6,334,099 B1 | * | 12/2001 | Grace et al. ................ 702/194 |
| 6,360,021 B1 | * | 3/2002 | McCarthy et al. .......... 382/254 |
| 6,536,022 B1 | * | 3/2003 | Aingaran et al. .............. 716/5 |
| 6,538,451 B1 | * | 3/2003 | Galli et al. ................. 324/533 |
| 6,574,282 B1 | * | 6/2003 | Okado ........................ 375/260 |
| 6,580,752 B1 | * | 6/2003 | Amrany et al. ............. 375/225 |
| 6,732,065 B1 | * | 5/2004 | Muddu ......................... 703/2 |
| 6,839,429 B1 | * | 1/2005 | Gaikwad et al. ............ 379/417 |

OTHER PUBLICATIONS

Wang et al., "Effect of bridge taps on channel capacity at VDSL frequencies", IEEE 1999.*

(Continued)

*Primary Examiner*—Paul L. Rodriguez
*Assistant Examiner*—Kandasamy Thangavelu
(74) *Attorney, Agent, or Firm*—Robert G Crouch; Gregory T. Fettig; Marsh, Fischmann & Breyfogle LLP

(57) ABSTRACT

A method and system for generating an accurate model of noise created through near end crosstalk (NEXT) when qualifying DSL loops. The model is configured such that it may account for loop characteristics such as fill and gauge of a particular loop, and disturbers which may create a noise environment within the particular binder group. The noise model may further be employed in an automated system which, based on stored characteristics for a particular loop, is employed to generate a noise value which is then further employable in a qualification analysis.

31 Claims, 7 Drawing Sheets

OTHER PUBLICATIONS

Schmucking et al., "Transmission capacity and design of a VHDSL system", IEEE 1996.*

Kalet et al., "On the capacity of a twisted-wire pair: Gaussian model", IEEE 1990.*

Crespo et al., "Optimization of pre- and post-filters in the presence of near- and far-end crosstalk", IEEE 1989.*

* cited by examiner

LOOP 3 (FILL = AIR)

| SEGMENT | TYPE | LENGTH | FILL |
|---|---|---|---|
| 1 | 24NL | 0.756 KFT | AIR |
| 2 | 26NL | 9.207 KFT | GEL |
| 3 | 26BT | 0.436 KFT | AIR |
| 4 | 26NL | 2.112 KFT | AIR |

NUMBER OF DISTURBERS WITHIN BINDER GROUP

| TYPE OF DISTURBER | CENTRAL OFFICE END | CUSTOMER END |
|---|---|---|
| T1 | 2 | 0 |
| HDSL | 3 | 1 |
| ISDN | 1 | 0 |

FIG. 5

METHOD AND SYSTEM FOR MODELING NEAR END CROSSTALK IN A BINDER GROUP

RELATED APPLICATIONS

This application claims priority under 35 U.S.C. §119 to prior U.S. Provisional patent application Ser. No. 60/215,493 filed Jun. 30, 2000, the entirety of which is hereby incorporated by reference.

FIELD OF THE INVENTION

The present invention relates to a method and system for estimating crosstalk when providing digital subscriber line (DSL) service and more particularly a method for modeling the noise and employing the model in qualifying lines of service.

BACKGROUND OF THE INVENTION

A primary factor affecting the distance from a central office that digital subscriber line (DSL) service can be provided is the noise environment experienced by the line over which the service is offered. Therefore, it is important in deploying DSL service to have an accurate estimate of the noise value. The greater the noise value, the less distance from the central office that DSL service maybe provided. If the estimates of the noise values are too high, a high failure rate will occur as service is installed beyond what is a reliable distance. estimates of the noise are too high, potential subscribers who could have service reliably provided would be denied.

Typically there are several sources of noise "near end crosstalk (NEXT), far end crosstalk (FEXT), and ambient noise (AM Radio, etc.)." Crosstalk (both near and far) is noise generated when a signal on one twisted pair electromagnetically couples to another. The strength of this coupling is significant only when the two twisted pairs are within the same binder group. As the name indicates, NEXT is that noise which couples from a transceiver (a DSL modem or any other signal generator) at the near end of the cable and FEXT is that noise which couples from a transceiver at the far end of the cable.

Typically, the magnitude of any NEXT is much greater than FEXT since the source of disturbance is closer to the affected transceiver. A variety of factors may affect the level of any NEXT, including the frequency of the signal, the number of pairs which have disturbing signals on them, the type of cable in which the signal is present, and the specific pairs within the cable.

A current model which exists and has been adopted by the ANSI T1E1 standards body, estimates the transfer functions for the noise at the 1% worst case level, meaning that in only 1% of the cases would the noise be worse than this level, in 99% of the cases the noise will not be as bad. The transfer function is simply the factor by which the strength of the original signal is multiplied to obtain the strength of the noise. The ANSI model depends on the frequency of the signal and the number of disturbing pairs. The signal strength is assumed identical in each of the disturbing pairs. An opinion held by some is that the current model is conservative and over estimates the noise.

SUMMARY OF THE INVENTION

The inventor has recognized that a model may be provided which describes the entire distribution of the noise, not just the 1% level, given a frequency and a number of disturbers. The inventor has further recognized that the use of this model would be beneficial in a system or method for qualifying DSL service based on location of customer.

Disclosed herein is a method for calculating the noise value within which one or more twisted pairs (loops) in a binder group may operate in the provision of digital subscriber line (DSL) service. In calculating a noise value for a single twisted pair, a first step performed is to determine the binder group within which a particular loop is located. In building a noise model to predict the noise value, the frequency range of the signals carried over the loop is identified as well as the quantile adjustment for the model. The model may be various characteristics of the binder group as well as characteristics of the twisted pairs which will carry signals. Finally, further features of the binder group included in the model may be the number and type of the disturbers in the binder group which may affect the noise environment.

One purpose may include performing a qualification process for a particular loop to carry DSL service, whereby based on the noise value at a particular location and known signal attenuation as related to distance from signal source, a signal-to-noise ratio may be calculated which is comparable against a minimum value in order to qualify a loop.

In one configuration of the invention, the characteristics employable in generating a noise value may include the fill (air and/or gel) employed within the sheath for a particular binder group as well as the gauge of the conductive alloy (24 or 26) employed in the twisted pair of interest. Taking into account these characteristics, the transfer function for the noise value may be modeled as follows:

$$\text{NEXT} = \mu + \alpha_f + \beta_q + \lambda_n + \gamma_T + \kappa_{q,n} + \psi_{f,T}$$

wherein NEXT is the near end crosstalk noise value or noise amplitude;

$\mu$ is the overall mean of the noise value;

$\alpha_f$ is the frequency of signals effect;

$\beta_q$ is the quantile effect;

$\lambda_n$ is the number of disturber effects;

$\gamma_T$ is the cable type effect which accounts for cable gauge and fill of the binder group;

$\kappa_{q,n}$ is the quantile: number of disturbers interaction;

$\psi_{f,T}$ is the frequency: cable type interaction;

f is frequency of signals transmitted;

q is quantile;

n is number of disturbers; and

T is type of cable in terms of cable gauge and fill of the binder group.

The noise model described above may be further employable to define market specific loss thresholds which may be acceptable for business and residential use. Further, the model may be employable to correlate the economic impact of future failure rate with reach. In employing the model for the above purposes, various computing equipment which is known in the art may be employed.

A further application of the noise model may be in a system which provides dynamic qualification for DSL services. Included in such a system may be a memory which includes listings for each loop within a binder group. The listing may include selected characteristics as well as information relating to the binder group. Items which may be contained in the database include the length of the segments for a loop, gauge of each length, number and type of disturbers within the binder group.

The system is then configured such that depending on the twisted pair within a binder group selected, an initial analysis may be performed to calculate a noise value at a particular location using the improved noise model. As the number of disturbers grows, the model for the noise becomes more complex in that it must take in to account the relative positions of the disturbers with regards to loop being studied.

BRIEF DESCRIPTION OF THE DRAWINGS

FIG. 5 discloses a table which includes a listing of binder groups stored in memory.

DETAILED DESCRIPTIONS

Figure 1:
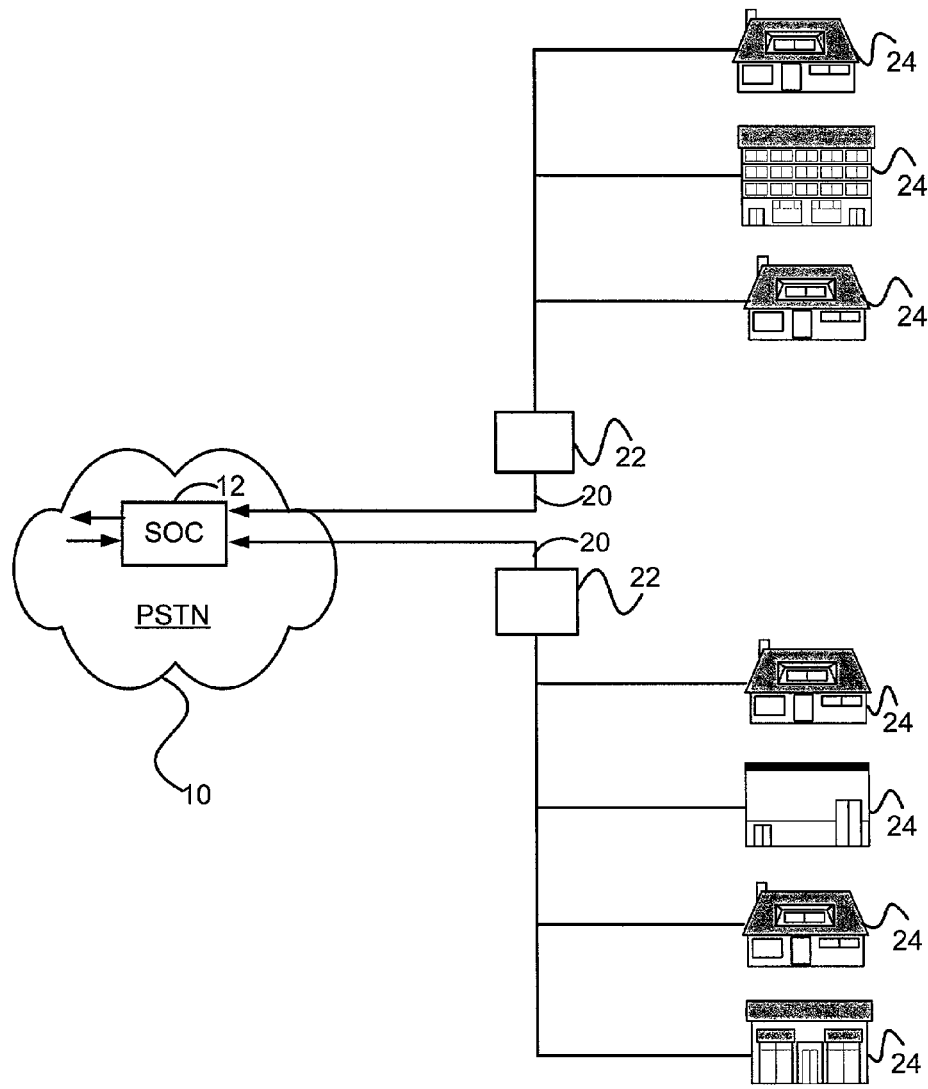
FIG. 1 discloses the system architecture within which DSL service is provided.

Disclosed in FIG. 1 is a communications system architecture within which digital subscriber line (DSL) service is provided. As is known, DSL service is provided over voice line through a central office switch 12 within a public switch telephone network (PSTN) 10. Types of DSL may include asymmetric digital subscriber line (ADSL), high bit rate digital subscriber line (HDSL), and signal pair symmetrical services (SDSL). DSL may also comprise an integrated services digital network (ISDN) channel. DSL services are typically provided over the twisted pairs which provides the voice connection to the locations receiving the services. Typically, the twisted pairs runs to the voice remote location 24 from the central office switch 12 in binder group 20. A binder group is a group of wires within a large cable that is typically distinguished from other groups because it is sheathed and wrapped with color threads. Normal telephone color-coding provides for 25 pairs of wires within a particular binder group. These 25 pairs are contained within a common cable sheath.

In order to track the services provided over all of the twisted pair and binder groups, the current status of each twisted pair may be stored in a database which is accessible when qualification processes are to be performed. Computational equipment such as a personal computer or any sort of networked processing capability known in the art may be employed in performing this process. The qualification process for loops will be described in greater detail below.

Referring again to FIG. 1, when providing DSL services to the remote locations 24, the distance, measured in the length of the cable within which the twisted pair is routed, is a main consideration. As is well known, when electrical signals are transmitted over conductive lines, ID the strength of the signal attenuates the further the signal travels from the source. Other things which affect the quality of the signal are the noise environment within which the twisted pair carrying the DSL signal must operate. In qualifying a DSL line of service, an established signal to noise ratio (SNR) must be met at the remote location in order to provide quality service. Simply put, if a customer is beyond a distance where the estimate of the SNR falls below a certain level, services may not be provided.

In order to calculate an accurate, SNR a fairly precise noise model must be employed which represents the environment within which the binder group which contains a particular twisted pair must pass. Sources of noise which may be modeled include near end crosstalk (NEXT) and far end crosstalk (FEXT).

Figure 2:
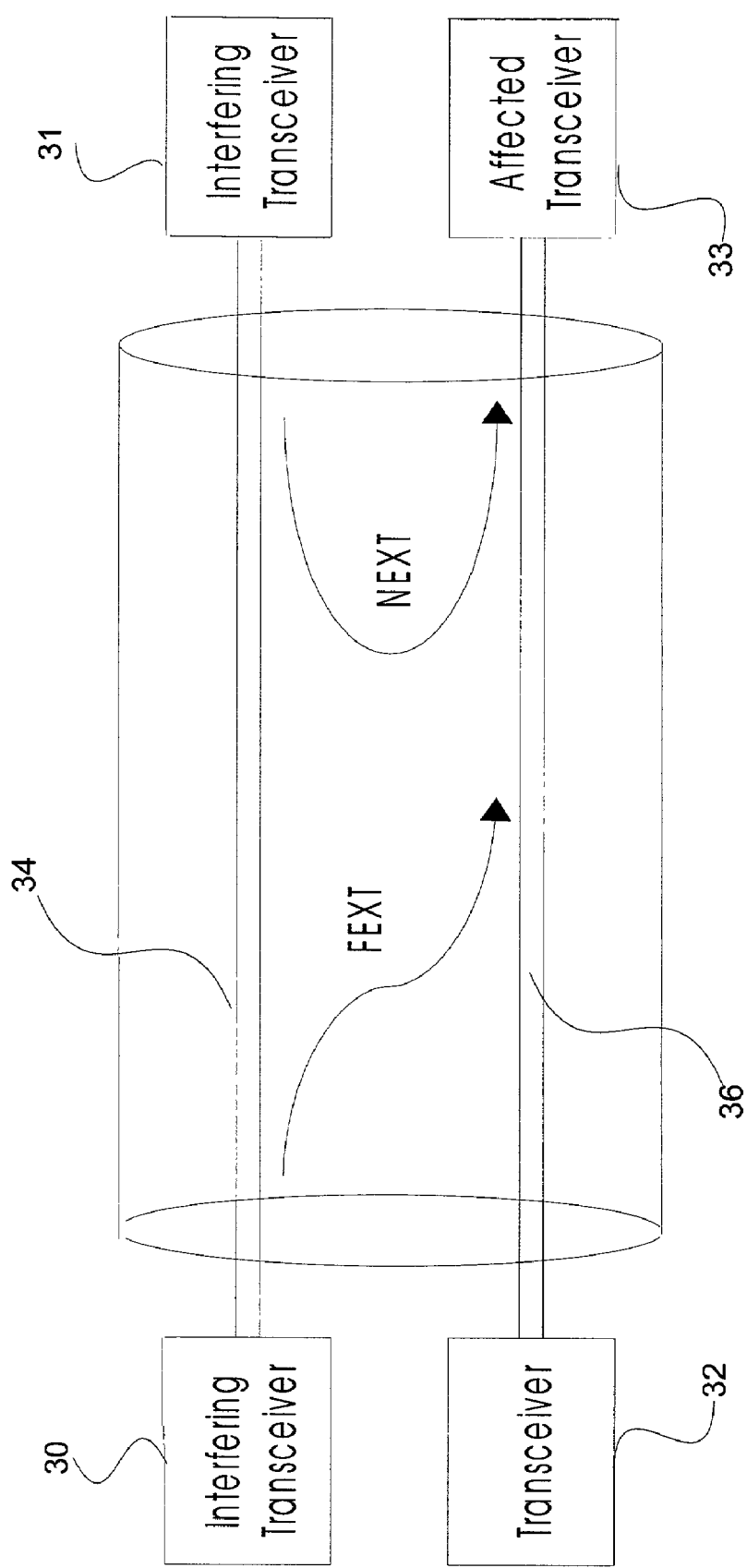
FIG. 2 is a system diagram which shows the effects of near end and far end crosstalk.

Disclosed in FIG. 2 is a diagram, which illustrates the effects of NEXT and FEXT on DSL service. In typical operation, a DSL signal originates from a transceiver 32 which may be located at the central office switch or at the location receiving the services. The DSL signal is transmitted over a particular twisted pair 36 to an affected transceiver 33. As was discussed above, also included in each binder groups are a number of other twisted pairs which also may be carrying any number of types of signals. These signals would originate from an interfering transceiver 30 and be transmitted over twisted pair 34 in the same binder group to interfering transceiver 31. As is known, crosstalk (both near and far end) is noise generated when signal on one twisted pair electromagnetically couples to another. The strength of this coupling is significant only when the two twisted pairs are within the same binder group. The magnitude of NEXT typically is much greater than FEXT since the source of the disturbance (i.e., the interfering transceiver 31) is closer to the affected transceiver 33. A variety of factors may affect the level of the NEXT, including frequency of the signal, the number of pairs in the binder group which have disturbing signals on them, the type of cable on which the signal is present, and the specific pairs within the cables.

Figure 3:
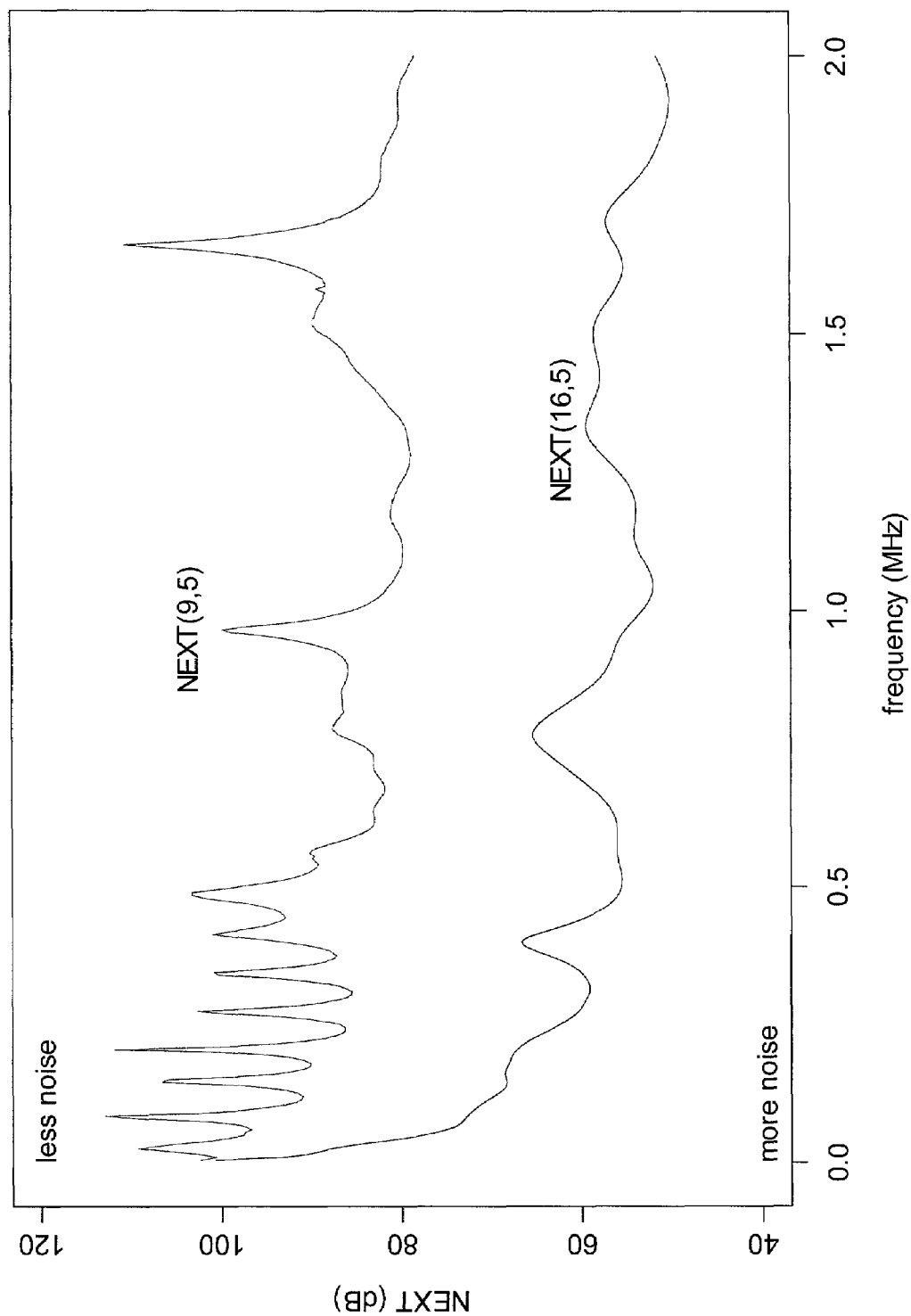
FIG. 3 discloses a graph which shows the effect of noise across frequency ranges for various lines within a binder group.

Disclosed in FIG. 3 is a plot of noise for two different pair combinations from the same binder group over a frequency range (0–2 MHZ). As can be seen, the noise value varies according to the frequency of the signal on the loop. This provides the advantage that the qualification may be done in an accurate noise environment, that is, if the loop is carrying a signal only within a known frequency range, qualification can be based on only that value.

Figure 4:
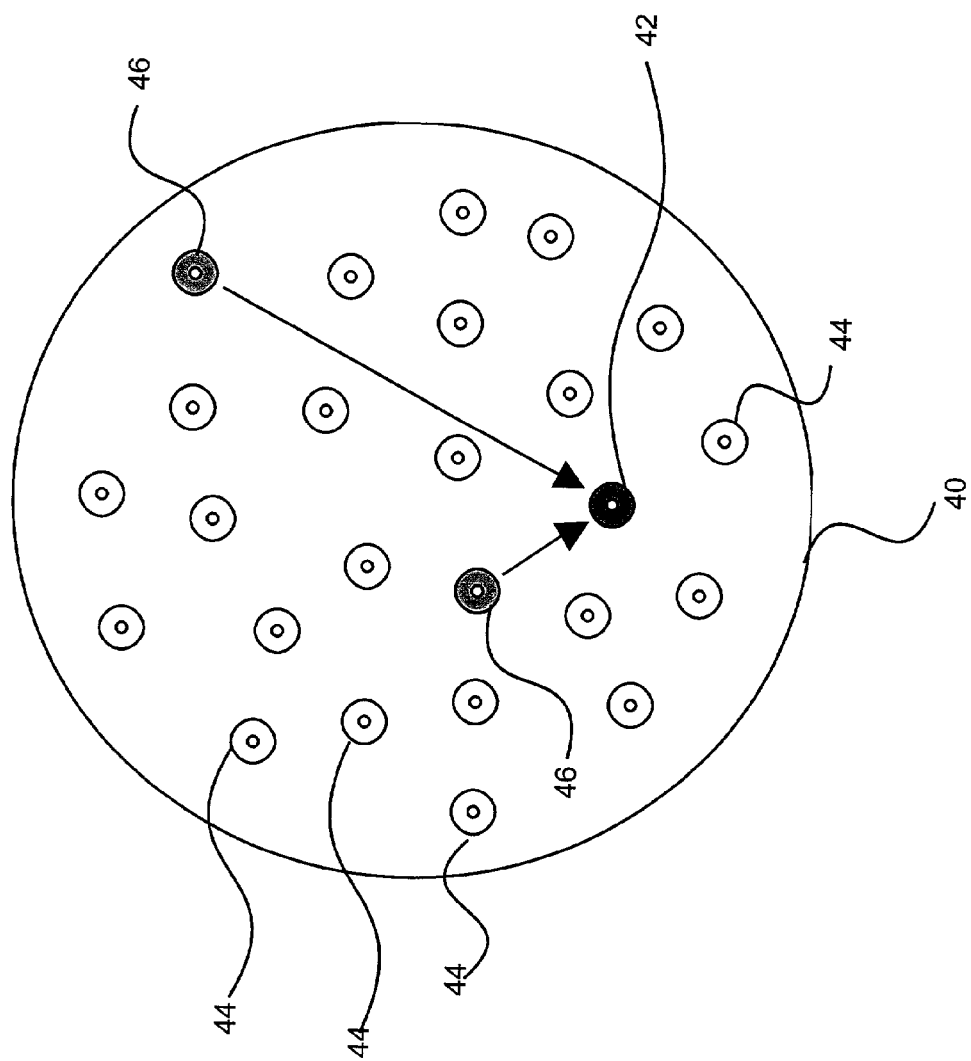
FIG. 4 discloses a cross section of a 25 pair binder group.

Disclosed in FIG. 4 is a cross sectional view of a binder group which includes at east one line 42 which is carrying a DSL signal, at least two disturbing twisted pairs 46 which affect on pair 42, and a number of non-disturbing twisted pairs 44. In generating an accurate noise model, it is important to take into account the affect each twisted pair will have on the others. Further, it is also important to as accurately as possible, account for all of the possible combinations of disturbers. A basic approach for calculating the affect of more than one disturbing pair (i.e., n is greater than 1) starts with understanding the distribution of all pair-pair (n=1) interactions. That is, a binder group may be characterized by knowing the affect on a pair j if we send a signal on pair I, where i and j are the indices from 1 to 25, indicating the particular pair within the binder group. This gives 600 interactions (the number of i, j combinations) per binder group per frequency. With a signal sent on pair i=1, 2, . . . , 25, a measurement of the induced signal may be made on pair j=1, 2, . . . , 25, j≠i. Thus the first index i refers to sending pair (the disturbing pair) and the second index j refers to the receiving pair (the disturbed pair).

As was mentioned above, other factors which may affect the noise model are the type of fill in the binder group as well as the gauge of the conductive metal used in the twisted pair. Returning again to the cross section of the binder group shown in FIG. 4, it is seen that between each of the twisted pairs an open space exist. The cross section shown greatly exaggerates this space, however, this space does exist and how it is filled has been shown to affect a twisted pairs susceptibility to noise. One construction of the binder group has the open space filled with air. Another, construction of the cable uses gel as a fill. It has been shown that this gel acts as a slight electromagnetic shield.

The other factor taken into account is the gauge of the metallic conductor used in the twisted pair. As would be expected, the higher the gauge of the conductor, the less resistance for conducting the electrical signal. This improves the signal to noise ratio. In typical binder group construction, 24 or 26 gauge copper alloy is employed.

There are two approaches to modeling NEXT, each with relative advantages. The first approach includes both fixed and random effects in the model. The fixed effects are frequency (f), number of disturbers (n), quantile (q), and a type of cable (T), a specific of combination of fill and gauge. Although cable type can be separated into two effects, fill and gauge, the interaction of these two effects is significant so that separation does not add any refinement to the model. The random affect is that different binder groups will produce different levels of NEXT even if all effects are identical. Random affect is referred to as binder group affect, noted by the symbol B. The most general model for the NEXT is:

$$NEXT = \Omega(f, q, n, T, B)$$

Where all higher order interactions of the variables are preserved through the function $\Omega$ A simpler model that still preserves the most important high order interactions of the variable is:

$$NEXT = \mu + \alpha_f + \beta_q + \lambda_n + \gamma_T + \kappa_{q,n} + \psi_{f,T} + \theta_B(T) + \pi f, B(T) + \chi_{q,B}(T) + \omega_{n,B}(T)$$

Notation of subscripting with respect to a variable indicates a dependence of that term on the variable. Note that the first seven terms on the right side of the equation are from fixed effects, while the last four model random effects. Also note that the random effects are nested, in that the binder group affect (B) is dependent on cable type (T). The advantage of this model is that it explicitly preserves and allows estimates of the random effects and allows for determination when large random effects are masking the fixed effects.

The second approach is to remove the random binder group effects prior to determining the fixed affect. In order to create the model using this approach, the distributions of the NEXT are first combined with each type of cable. The 1% to 10% quantiles are found from each of the combined distributions for each frequency and number of disturbers. This gives a set of values of the NEXT that depends on only four variables: the frequency, quantile, number of disturbers, and type of cable. The transfer function that preserves the most important high order interaction of the variables using this approach is:

$$NEXT = \mu + \alpha_f + \beta_q + \lambda_n + \gamma_T + \kappa_{q,n} + \psi_{f,T,}$$

wherein NEXT is the near end crosstalk noise value or noise amplitude;

$\mu$ is the overall mean of the noise value;

$\alpha_f$ is the frequency of signals effect;

$\beta_q$ is the quantile effect;

$\lambda_n$ is the number of disturber effects;

$\gamma_T$ is the cable type effect which accounts for cable gauge and fill of the binder group;

$\kappa_{q,n}$ is the quantile: number of disturbers interaction;

$\psi_{f,T}$ is the frequency: cable type interaction;

f is frequency of signals transmitted;

q is quantile;

n is number of disturbers; and

T is type of cable in terms of cable gauge and fill of the binder group.

The binder group effects ($\theta_{B(T)}$, $\pi_{f,B(T)}$, $\chi_{q,B(T)}$ and $\omega_{n,B(T)}$) are lost by combining the distributions first. The advantage of this approach is that it gives a more appropriate estimate of the fixed effects. To determine the level of NEXT that represents the overall 1% worst-case level in the entire population, the correct procedure first combines all the possible values of NEXT into the single distribution, and then determines the quantile level, as in this second approach. Since the second approach provides a better estimate of the fixed affect, it will be use to determine those effects and, therefore, to determine the main terms in the final model. Since the first approach provides an estimate of the random effect, it will be used to estimate that part of the model.

As can been seen, the noise model employed herein includes a dependence on quantile (q=1% to 10%) and cable type, which include: Fill (Aircore, Gel Fill) and Gauge (24AWG, 26AWG) which provides a greater degree of accuracy. According to the new model, it includes a baseline noise model which is dependent on frequency of the signal to be transmitted and the number of disturbers and is comparable to the ANSI model for NEXT and it comprises:

$$Next_{Baseline} = \mu + \alpha_f + \lambda_n =$$
$$139.69 - 14.76\log_{10}f - 4.55\log_{10}n - 0.038n + (0.61/(n^2 + 1)),$$

wherein $NEXT_{Baseline}$ is noise value which is dependent on frequency of the signal to be transmitted and the number of disturbers;

$\mu$ is the overall mean of the noise value;

n is number of disturbers;

f is frequency of signals transmitted;

$\alpha_f$ is the frequency of signals effect; and $\lambda_n$ is the number of disturber effects.

The following table details the improvements over the ANSI model which may be seen by use of the baseline model described herein. It should be noted that the table below and those that follow only include a limited sampling of information for a particular binder group:

| # of disturbers | Avg. Improvement |
| --- | --- |
| 1 | +0.63 dB |
| 2 | +0.98 dB |
| 3 | +1.13 dB |
| 4 | +1.21 dB |
| 6 | +1.32 dB |
| 8 | +1.39 dB |
| 12 | +1.47 dB |

As was discussed above, included in the model are terms which account for the fill and gauge characteristics of the binder group. This portion of the equation is model by the following:

$$\text{Fill/gauge adjustment} = \gamma_T + \psi_{f,T} = \gamma_T^{(1)} + \gamma_T^{(2)}\log_{10}f$$

where $\gamma_T^{(1)}$ and $\gamma_T^{(2)}$ are constants and may comprise for the different gauge and fill combinations:

$\hat{\gamma}_{Gel/24}^{(1)} = -2.16$   $\hat{\gamma}_{Gel/24}^{(2)} = 0.49$ $\hat{\gamma}_{Gel/26}^{(1)} = 5.51$   $\hat{\gamma}_{Gel/26}^{(2)} = -0.73$ $\hat{\gamma}_{Air/24}^{(1)} = -3.73$   $\hat{\gamma}_{Air/24}^{(2)} = 0.39$ $\hat{\gamma}_{Air/26}^{(1)} = 0.38$   $\hat{\gamma}_{Air/26}^{(2)} = -0.15$, wherein $\gamma_T$ is the cable type effects which account for cable gauge and fill of the binder group and is dependent on the constants $\gamma_T^{(1)}$ and $\gamma_T^{(2)}$;

f is frequency of signals transmitted;

T is type of cable in terms of cable gauge and fill of the binder group; and $\psi_{f,T}$ is the frequency: cable type interaction.

By employing fill/gauge adjustment described above, the following improvement are noted with regards to the noise model:

| Type | Avg. Adjustment |
|---|---|
| Gel, 26 g | +1.22 dB |
| Gel, 24 g | +0.72 dB |
| Air, 26 g | -0.50 dB |
| Air, 24 g | -1.44 dB |

Also included in the model is the quantile adjustment. This adjustment is represented by the following:

Quantile adjustment =

$$\beta_q + \kappa_{q,n} = 8.648(q^{0.236} - 1) - 3.634\log_{10}((q + 0.340)/1.340)\log_{10} n - 0.023(\exp(-0.615(q - 1)) - 1)n + \frac{(q - 1)(0.158 + 0.00833(q + 1))}{n^2 + 1},$$

wherein $\beta_q$ is the quantile effect;

q is quantile;

n is number of disturbers; and $\kappa_{q,n}$ is the quantile: number of disturbers interaction.

The following table shows in particular the improvements over the ANSI model at the selected quantile and number of disturbers:

| # of disturbers | 1% | 2% | 5% | 10% |
|---|---|---|---|---|
| 1 | 0.00 | +1.68 dB | +4.43 dB | +7.42 dB |
| 2 | 0.00 | +1.33 dB | +3.49 dB | +5.68 dB |
| 3 | 0.00 | +1.16 dB | +3.06 dB | +4.95 dB |
| 4 | 0.00 | +1.06 dB | +2.79 dB | +4.50 dB |
| 6 | 0.00 | +0.93 dB | +2.45 dB | +3.93 dB |
| 8 | 0.00 | +0.84 dB | +2.22 dB | +3.57 dB |
| 12 | 0.00 | +0.72 dB | +1.92 dB | +3.08 dB |

A further generalization models the noise when more than one type of disturber is present. That is, distributions of NEXT are sought where there are $n_1$ disturbers of a first type, $n_2$ disturbers of second type etc, as a function of frequency f. The modeling of the transfer functions discussed above was done without regards to the type of disturber present, because the power spectral density (PSD) (in dB/Hz) of the disturber is simply a multiplicative factor of the transfer function. The other disturbers present may fall within the ANSI SM classes which includes ISDN lines, HDSL, and ADSL. Each of these DSL services affect other twisted pairs in different ways. A general model which accounts for multiple disturber types is as follows:

$$PSD_{NEXT} = 1.3781 \times 10^{-14} \cdot 10^{-(\gamma_T^{(1)} + \xi)/10} \cdot f^{1.476 - \gamma_T^{(2)}/10} \cdot \left( \sum_{i=1}^{N} (S_i)^{10/v} n_i \right)^{v/10}$$

wherein:

$PSD_{NEXT}$ is power spectral density;

$\gamma_T^{(1)}$ and $\gamma_T^{(2)}$ are the cable type effects which account for cable gauge and fill of the binder group;

$\xi = -4.145 + 5.597\, q^{0.344}$;

f is frequency of signals transmitted;

T is type of cable in terms of cable gauge and fill of the binder group;

N = number of disturber types;

$n_i$ = number of disturbers of Type i;

$S_i$ = PSD of disturbers of Type i;

$v = 3.028 + 2.352\, q^{0.385}$; and q is quantile.

The model described herein may have many uses with regards to the provision of DSL services. In one application, the model may be employable to define market specific loss thresholds which may be acceptable for business and residential use. Also, the model employable to correlate the economic impact of future failure rate with reach. This model may further allow for an analysis to be performed to determine the balance tradeoff between adding more loops and higher failure rates. As will be seen through use of the model, the more loops employed to carry a DSL signal in a binder group the more disturbing pairs are created and the higher the impact of the noise environment. The model allows for a more accurate analysis of the threshold value.

The model described herein may still further provide the ability to optimize the deployment of a particular cable type. As was discussed above, cable types may include different types of fill as well as gauges for the twisted pairs. By employing this model, binder groups may be configured to maximize the number of loops carrying the signal and minimize the noise environment.

Still yet another use of the noise model described herein may relate to the performance of dynamic loop qualification providing DSL services. When providing DSL services to customers, providers typically perform an analysis to determine whether a particular loop qualifies to carry DSL service. Based on information known about the loop and the binder group, the number and a quick calculation using the models described herein may be performed to provide this qualification indication.

Disclosed in FIG. 5 is an example table which may be stored in the database and includes configuration information for a particular loop within a binder group. Information in the table for a loop includes a description of the segments which make up a loop. The description may include the gauge and fill for the twisted pairs as well as the connectivity (non loaded (NL) or bridged tap (BT)) of the particular segment. Also included in the entry may be a description of the other disturbers in the binder group. A separate table may identify the number and type of disturbers, as well as associated noise values. Information stored separately may include noise values associated with different types of disturbers as well as an acceptable signal to noise ratio for qualifying the loops.

Figure 6A:
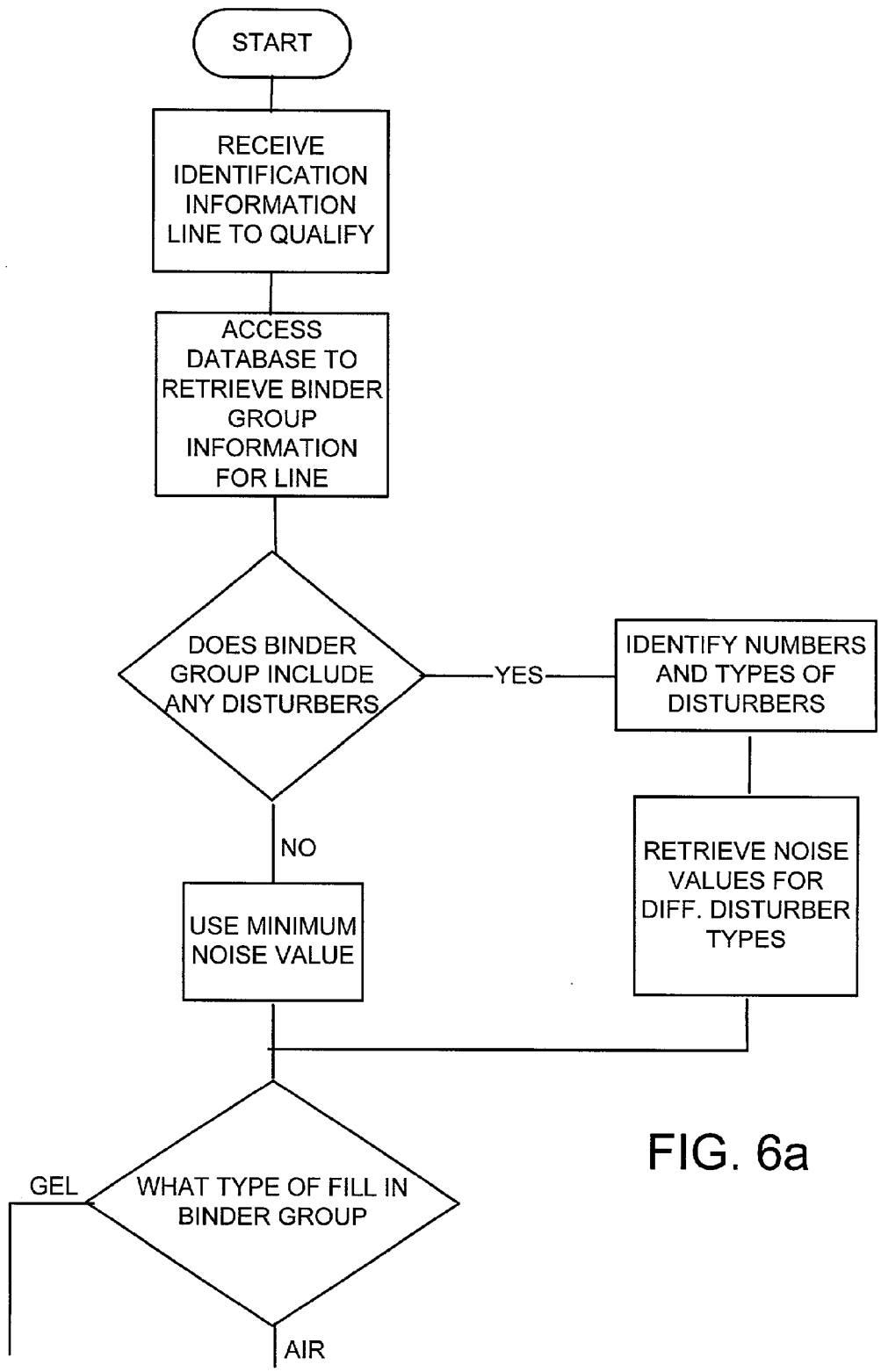
FIGS. 6a and b disclose a flow chart which describes the operation of the DSL qualification system.
Figure 6B:
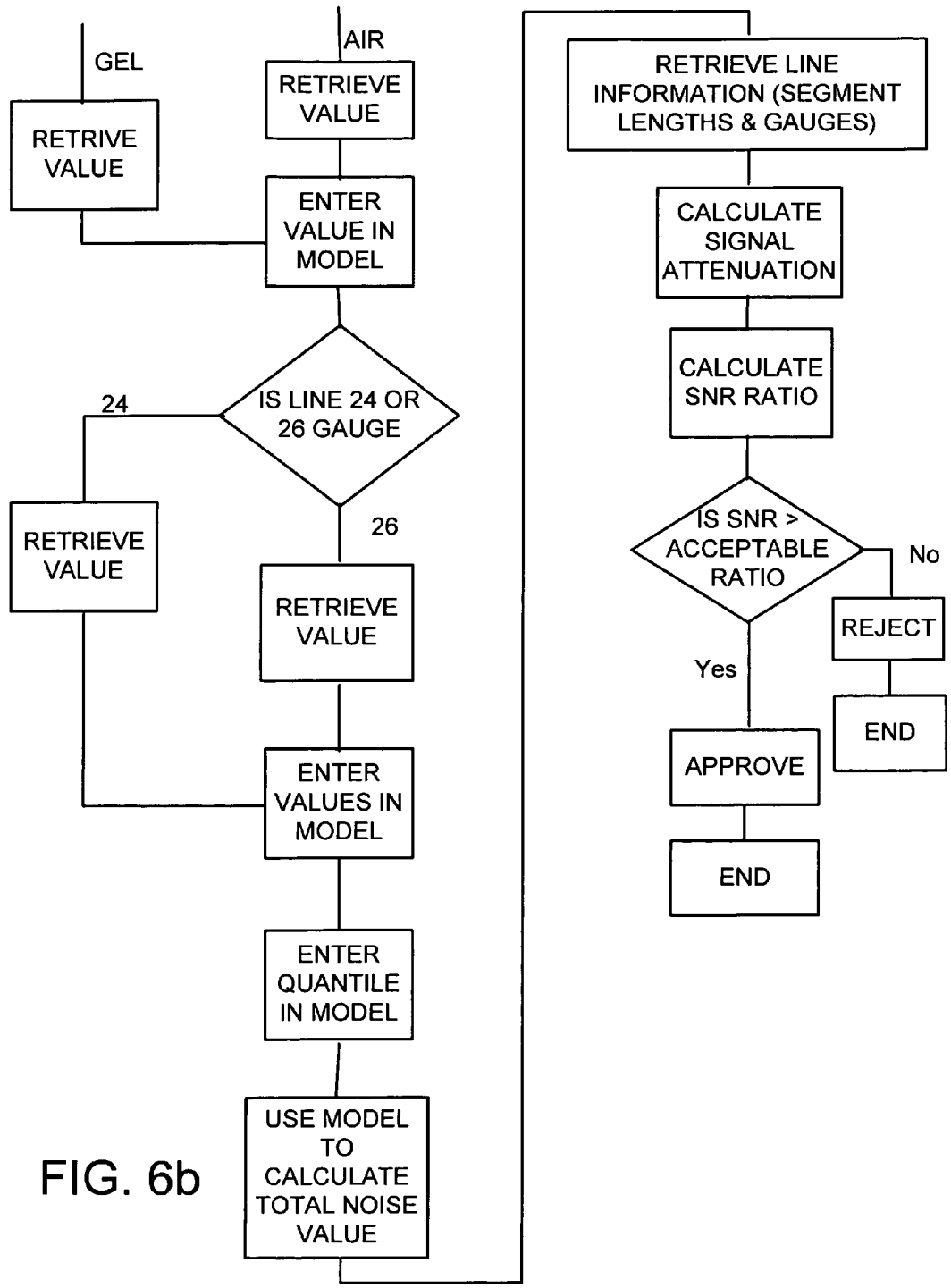

Described in FIG. 6a and 6b is a flow chart which describes in detail the steps performed in qualifying a particular loop. As an initial step, identification information is received with regards to a loop that is to be qualified. At this point, the database is accessed and all relevant information with regards to the loop and the binder group which it is part of is retrieved. An initial query is made as to whether the binder group to which the loop is part of includes any disturbers. If there are other the disturbers, they are identified and noise values for the particular types of disturbers are retrieved. If the binder group does not include any other disturbers a minimum noise value may be retrieved from memory and included in the noise model.

Once the disturber information is retrieved and employed in the noise model, a further query may be made as to the type of fill employed in the loop. If the fill is gel, this value is retrieved and entered in the model. If the fill is air this is also retrieved and inserted in the model.

A further query is then made as to the gauge for the twisted pair. If the gauge is either 24 or 26 the appropriate values are retrieved from memory and included in the model. In qualifying the loop, a quantile value may be entered and a noise model for the NEXT generated.

In order to perform the actual qualification process, the length of the loop is retrieved from memory and the signal attenuation from the central office to the location receiving the services is calculated. This calculated value is then compared against a predetermined signal and if the SNR is greater than the minimum value, the loop is approved. If it is less, it is rejected.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant art, are within the scope of the present invention. The embodiments described hereinabove are further intended to explain best modes known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

The invention claimed is:

1. A method for predicting a near end crosstalk (NEXT) noise value for a twisted pair in a telecommunications network comprising the steps of:

identifying a binder group with at least one digital subscriber line, wherein the step of identifying comprises further identifying a plurality of characteristics about the binder group as well as about at least one twisted pair;

wherein the characteristics include at least a gauge of the at least one twisted pair and a fill for at least one binder group;

identifying at least one frequency value for signals to be transmitted over the at least one twisted pair in which to measure the noise value;

identifying a number of and type of at least one disturber within the binder group which may contribute to the noise value;

identifying a desired quantile adjustment; and formulating a noise model to calculate a noise value wherein the noise model accounts for the at least one frequency value for signals to be transmitted over the at least one twisted pair, the number and type of the at least one disturber within the binder group, the desired quantile adjustment as well as the characteristics of the binder group including at least the gauge of the at least one twisted pair and the fill for the at least one binder group.

2. The method of claim 1 wherein the at least one twisted pair is employable for providing digital subscriber line (DSL) service.

3. The method of claim 1 wherein the gauge includes at least one of: 24 and 26 gauge copper alloy.

4. The method of claim 2 wherein the fill for the binder group includes at least one of: air and gel.

5. The method of claim 1 further comprising the step of using known signal attenuation over the at least one twisted pair to calculate a signal-to-noise ratio.

6. The method of claim 1 wherein the near end crosstalk (NEXT) noise value is given by the noise model:

$$NEXT = \mu + \alpha_f + \beta_q + \lambda_n + \gamma_T + \kappa_{q,n} + \psi_{f,T},$$

wherein NEXT is the near end crosstalk noise value or noise amplitude;

$\mu$ is the overall mean of the noise value;

$\alpha_f$ is the frequency of signals effect;

$\beta_q$ is the quantile effect;

$\lambda_n$ is the number of disturber effects;

$\gamma_T$ is the cable type effect which accounts for cable gauge and fill of the binder group;

$\kappa_{q,n}$ is the quantile: number of disturbers interaction;

$\psi_{f,T}$ is the frequency: cable type interaction;

f is frequency of signals transmitted;

q is quantile;

n is number of disturbers; and

T is type of cable in terms of cable gauge and fill of the binder group.

7. The method of claim 6 wherein a baseline noise model which is dependent on frequency of the signal to be transmitted and the number of disturbers and is comparable to the ANSI model for NEXT comprises:

$$NEXT_{Baseline} = \mu + \alpha_f + \lambda_n =$$
$$139.69 - 14.76\log_{10} f - 4.55\log_{10} n - 0.038n + (0.61/(n^2 + 1)),$$

wherein $NEXT_{Baseline}$ is noise value which is dependent on frequency of the signal to be transmitted and the number of disturbers;

$\mu$ is the overall mean of the noise value;

n is number of disturbers;

f is frequency of signals transmitted;

$\alpha_f$ is the frequency of signals effect; and $\lambda_n$ is the number of disturber effects.

8. The method of claim 7 wherein the fill and gauge are modeled with the following equation:

$$\text{Fill/gauge adjustment} = \gamma_T + \psi_{f,T} = \gamma_T^{(1)} + \gamma_T^{(2)} \log_{10} f$$

where $\gamma_T^{(1)}$ and $\gamma_T^{(2)}$ are constants and may comprise for the different gauge and fill combinations:

$\hat{\gamma}_{Gel/24}^{(1)} = -2.16$  $\hat{\gamma}_{Gel/24}^{(2)} = 0.49$ $\hat{\gamma}_{Gel/26}^{(1)} = 5.51$  $\hat{\gamma}_{Gel/26}^{(2)} = -0.73$ $\hat{\gamma}_{Air/24}^{(1)} = -3.73$  $\hat{\gamma}_{Air/24}^{(2)} = 0.39$ $\hat{\gamma}_{Air/26}^{(1)} = 0.38$  $\hat{\gamma}_{Air/26}^{(2)} = -0.15$, wherein $\gamma_T$ is the cable type effects which account for cable gauge and fill of the binder group and is dependent on the constants $\gamma_T^{(1)}$ and $\gamma_T^{(2)}$;

f is frequency of signals transmitted;

T is type of cable in terms of cable gauge and fill of the binder group; and $\psi_{f,T}$ is the frequency: cable type interaction.

9. The method of claim 8 wherein the quantile is modeled by the following equation:

Quantile adjustment =

$$\beta_q + \kappa_{q,n} = 8.648(q^{0.236} - 1) - 3.634\log_{10}((q + 0.340)/1.340)\log_{10}n - $$
$$0.023(\exp(-0.615(q-1))-1)n + $$
$$(q-1)(0.158 + 0.00833(q+1))/n2 + 1,$$

wherein $\beta_q$ is the quantile effect;

q is quantile;

n is number of disturbers; and $\kappa_{q,n}$ is the quantile: number of disturbers interaction.

10. The method of claim 9 wherein the noise model for power spectral density with multiple disturber types comprises:

$$PSD_{NEXT} = 1.3781 \times 10^{-14} \cdot 10^{-(\gamma_T^{(1)}+\xi)/10} \cdot f^{1.476-\gamma_T^{(2)}/10} \cdot \left(\sum_{i=1}^{N} (S_i)^{10/v} n_i\right)^{v/10}$$

wherein:

$PSD_{NEXT}$ is power spectral density;

$\gamma_T^{(1)}$ and $\gamma_T^{(2)}$ are the cable type effects which account for cable gauge and fill of the binder group;

$\xi = -4.145 + 5.597\ q^{0.344}$;

f is frequency of signals transmitted;

T is type of cable in terms of cable gauge and fill of the binder group;

N=number of disturber types;

$n_i$=number of disturbers of Type i;

$S_i$=PSD of disturbers of Type i;

$v = 3.028 + 2.352\ q^{0.385}$; and q is quantile.

11. The method of claim 10 wherein the multiple disturber types include any of the ANSI SM classes including: ADSL, ISDN, HDSL and T1.

12. A method of qualifying at least one loop in a telecommunications for digital subscriber line (DSL) service, comprising the steps of:

identifying a binder group in a telecommunications network which the at least one loop is part of;

retrieving from memory characteristics of the binder group and a plurality of twisted pairs included in the binder group, wherein the characteristics include at least a gauge of at least one twisted pair and a fill for at least one binder group;

retrieving from memory at least one frequency value for signals to be transmitted over the at least one twisted pair in which to measure a noise value;

retrieving from memory information relating to a number and type of at least one disturber included in the binder group;

retrieving from memory a desired quantile adjustment;

calculating a noise value at a selected location for the at least one loop using a noise model wherein the noise model accounts for the at least one frequency value for signals to be transmitted over the at least one twisted pair, the number and type of the at least one disturber within the binder group, the desired quantile adjustment as well as the characteristics of the binder group including at least the gauge of the at least one twisted pair and the fill for the at least one binder group;

calculating a signal attenuation for the loop and a signal-to-noise ratio at the selected location; and determining whether the signal-to-noise ratio exceeds a predetermined value.

13. The method of claim 12 wherein the gauge includes at least one of: 24 and 26.

14. The method of claim 12 wherein the fill includes at least one of air and gel.

15. The method of claim 12 wherein the near end crosstalk (NEXT) noise value is given by the noise model:

$$NEXT = \mu + \alpha_f + \beta_q + \lambda_n + \gamma_T + \kappa_{q,n} + \psi_{f,T}$$

wherein NEXT is the near end crosstalk noise value or noise amplitude;

$\mu$ is the overall mean of the noise value;

$\alpha_f$ is the frequency of signals effect;

$\beta_q$ is the quantile effect;

$\lambda_n$ is the number of disturber effects;

$\gamma_T$ is the cable type effect which accounts for cable gauge and fill of the binder group;

$\kappa_{q,n}$ is the quantile: number of disturbers interaction;

$\psi_{f,T}$ is the frequency: cable type interaction;

f is frequency of signals transmitted;

q is quantile;

n is number of disturbers; and

T is type of cable in terms of cable gauge and fill of the binder group.

16. The method of claim 15 wherein a baseline noise model which is dependent on frequency of the signal to be transmitted and the number of disturbers and is comparable to the ANSI model for NEXT comprises:

$$Next_{Baseline} = \mu + \alpha_f + \lambda_n = $$
$$139.69 - 14.76\log_{10}f - 4.55\log_{10}n - 0.038n + (0.61/(n^2+1)),$$

wherein $NEXT_{Baseline}$ is noise value which is dependent on frequency of the signal to be transmitted and the number of disturbers;

$\mu$ is the overall mean of the noise value;

n is number of disturbers;

f is frequency of signals transmitted;

$\alpha_f$ is the frequency of signals effect; and $\lambda_n$ is the number of disturber effects.

17. The method of claim 16 wherein the fill and gauge are modeled with the following equation:

$$FILL/gauge\ adjustment = \gamma_T + \psi_{f,T} = \gamma_T^{(1)} + \gamma_T^{(2)}\log_{10}f$$

where $\gamma_T^{(1)}$ and $\gamma_T^{(2)}$ are constants and may comprise for the different gauge and fill combinations:

$\hat{\gamma}_{Gel/24}^{(1)} = -2.16$   $\hat{\gamma}_{Gel/24}^{(2)} = 0.49$ $\hat{\gamma}_{Gel/26}^{(1)} = 5.51$   $\hat{\gamma}_{Gel/26}^{(2)} = -0.73$ $\hat{\gamma}_{Air/24}^{(1)} = -3.73$   $\hat{\gamma}_{Air/24}^{(2)} = 0.39$ $\hat{\gamma}_{Air/26}^{(1)} = 0.38$   $\hat{\gamma}_{Air/26}^{(2)} = -0.15$, wherein $\gamma_T$ is the cable type effects which account for cable gauge and fill of the binder group and is dependent on the constants $\gamma_T^{(1)}$ and $\gamma_T^{(2)}$;

f is frequency of signals transmitted;

T is type of cable in terms of cable gauge and fill of the binder group; and $\psi_{f,T}$ is the frequency: cable type interaction.

18. The method of claim 17 wherein the quantile is modeled by the following equation:

$$\text{Quantile adjustment} = \beta_q + \kappa_{q,n} = 8.648(q^{0.236} - 1) - 3.634\log_{10}((q + 0.340)/1.340)\log_{10}n -$$
$$0.023(\exp(-0.615(q - 1)) - 1)n +$$
$$(q - 1)(0.158 + 0.00833(q + 1))/n2 + 1,$$

wherein $\beta_q$ is the quantile effect;

q is quantile;

n is number of disturbers; and $\kappa_{q,n}$ is the quantile: number of disturbers interaction.

19. The method of claim 18 wherein the noise model for power spectral density with multiple disturber types comprises:

$$PSD_{NEXT} = 1.3781 \times 10^{-14} \cdot 10^{-(\gamma_T^{(1)}+\xi)/10} \cdot f^{1.476-\gamma_T^{(2)}/10} \cdot \left(\sum_{i=1}^{N}(S_i)^{10/v}n_i\right)^{v/10}$$

wherein:

PSD$_{NEXT}$ is power spectral density;

$\gamma_T^{(1)}$ and $\gamma_T^{(2)}$ are the cable type effects which account for cable gauge and fill of the binder group;

$\xi = -4.145 + 5.597q^{0.344}$;

f is frequency of signals transmitted;

T is type of cable in terms of cable gauge and fill of the binder group;

N=number of disturber types;

$n_i$=number of disturbers of Type i;

$S_i$=PSD of disturbers of Type i;

$v = 3.028 + 2.352\ q^{0.385}$; and q is quantile.

20. The method of claim 19 wherein the different characteristics may relate to at least one of: ADSL, ISDN, HDSL and T1.

21. A system for qualifying at least one loop in a binder group in a telecommunications network for carrying a communications signal, comprising:

a data network interface over which requests for qualification may be received;

a database configurable to store and provide access to a loop and binder grpup characteristics, wherein the characteristics for the binder group include a number and type of at least one disturber and at least a gauge of at least one twisted pair and a fill for at least one binder group, wherein the database is further configurable to store and provide access to at least one frequency value for signals to be transmitted over the at least one twisted pair in which to measure a noise value and a desired quantile adjustment;

processing means configurable to retrieve the characteristics for the at least one loop from memory, and using these characteristics in a noise model to calculate the noise value for at least one loop at a selected location, wherein the noise model accounts for the at least one frequency value for signals to be transmitted over the at least one twisted pair, the number and type of the at least one disturber within the binder group, the desired quantile adjustment as well as the characteristics of the binder group including at least the gauge of the at least one twisted pair and the fill for the at least one binder group; and the processing means further configured to compare a signal strength against the noise value to calculate a signal-to-noise ratio which is further employable to make a qualification determination.

22. The method of claim 21 wherein the database, the processing means, and the interface are resident on a central office switch for a public switched telephone number (PSTN).

23. The system of claim 21 wherein the gauge includes at least one of: 24 and 26.

24. The system of claim 21 wherein the fill includes at least one of air and gel.

25. The system of claim 21 wherein the noise model is calculated for a 25 twisted pair binder group.

26. The system of claim 21 wherein the near end crosstalk (NEXT) noise value is given by the noise model:

NEXT=$\mu + \alpha_f + \beta_q + \lambda_n + \gamma_T + \kappa_{q,n} + \psi_{f,T}$, wherein NEXT is the near end crosstalk noise value or noise amplitude;

$\mu$ is the overall mean of the noise value;

$\alpha_f$ is the frequency of signals effect;

$\beta_q$ is the quantile effect;

$\lambda_n$ is the number of disturber effects;

$\gamma_T$ is the cable type effect which accounts for cable gauge and fill of the binder group;

$\kappa_{q,n}$ is the quantile: number of disturbers interaction;

$\psi_{f,T}$ is the frequency: cable type interaction;

f is frequency of signals transmitted;

q is quantile;

n is number of disturbers; and

T is type of cable in terms of cable gauge and fill of the binder group.

27. The system of claim 26 wherein a baseline noise model which is dependent on frequency of the signal to be transmitted and the number of disturbers and is comparable to the ANSI model for NEXT comprises:

$$\text{Next}_{Baseline} = \mu + \alpha_f + \lambda_n =$$
$$139.69 - 14.76\log_{10}f - 4.55\log_{10}n - 0.038n + (0.61/(n^2 + 1)),$$

wherein NEXT$_{Baseline}$ is noise value which is dependent on frequency of the signal to be transmitted and the number of disturbers;

$\mu$ is the overall mean of the noise value;

n is number of disturbers;

f is frequency of signals transmitted;

$\alpha_f$ is the frequency of signals effect; and
$\lambda_n$ is the number of disturber effects.

28. The system of claim 27 wherein the fill and gauge are modeled with the following equation:

$$\text{Fill/gauge adjustment} = \gamma_T + \psi_{f,T} = \gamma_T^{(1)} + \gamma_T^{(2)} \log_{10} f$$

where $\gamma_T^{\wedge(1)}$ and $\gamma_T^{\wedge(2)}$ are constants and may comprise for the different gauge and fill combinations:

$$\hat{\gamma}_{Gel/24}^{\wedge(1)} = -2.16 \quad \hat{\gamma}_{Gel/24}^{\wedge(2)} = 0.49$$

$$\hat{\gamma}_{Gel/26}^{\wedge(1)} = 5.51 \quad \hat{\gamma}_{Gel/26}^{\wedge(2)} = -0.73$$

$$\hat{\gamma}_{Air/24}^{\wedge(1)} = -3.73 \quad \hat{\gamma}_{Air/24}^{\wedge(2)} = 0.39$$

$$\hat{\gamma}_{Air/26}^{\wedge(1)} = 0.38 \quad \hat{\gamma}_{Air/26}^{\wedge(2)} = -0.15,$$

wherein $\gamma_T$ is the cable type effects which account for cable gauge and fill of the binder group and is dependent on the constants $\gamma_T^{\wedge(1)}$ and $\gamma_T^{\wedge(2)}$;
f is frequency of signals transmitted;
T is type of cable in terms of cable gauge and fill of the binder group; and
$\psi_{f,T}$ is the frequency: cable type interaction.

29. The system of claim 28 wherein the quantile is modeled by the following equation:

Quantile adjustment =

$$\beta_q + \kappa_{q,n} = 8.648(q^{0.236} - 1) - 3.634 \log_{10}((q + 0.340)/1.340) \log_{10} n - $$

$$0.023(\exp(-0.615(q-1)) - 1)n + $$

-continued $$(q-1)(0.158 + 0.00833(q+1))/(n2+1),$$

wherein $\beta_q$ is the quantile effect;
q is quantile;
n is number of disturbers; and
$\kappa_{q,n}$ is the quantile: number of disturbers interaction.

30. The system of claim 29 wherein the noise model for power spectral density with multiple disturber types comprises:

$$PSD_{NEXT} = 1.3781 \times 10^{-14} \cdot 10^{-(\gamma_T^{(1)}+\xi)/10} \cdot f^{1.476-\gamma_T^{(2)}/10} \cdot \left(\sum_{i=1}^{N} (S_i)^{10/v} n_i\right)^{v/10}$$

wherein:
$PSD_{NEXT}$ is power spectral density;
$\gamma_T^{(1)}$ and $\gamma_T^{(2)}$ are the cable type effects which account for cable gauge and fill of the binder group;
$\xi = -4.145 + 5.597 q^{0.344}$;
f is frequency of signals transmitted;
T is type of cable in terms of cable gauge and fill of the binder group;
N = number of disturber types;
$n_i$ = number of disturbers of Type i;
$S_i$ = PSD of disturbers of Type i;
$v = 3.028 + 2.352 \ q^{0.385}$; and
q is quantile.

31. The system of claim 30 wherein the multiple disturber types include at least one ADSL, ISDN, HDSL and TI.

* * * * *

UNITED STATES PATENT AND TRADEMARK OFFICE
CERTIFICATE OF CORRECTION

PATENT NO. : 7,016,822 B2 Page 1 of 1
DATED : March 21, 2006
INVENTOR(S) : Bosley et al.

It is certified that error appears in the above-identified patent and that said Letters Patent is hereby corrected as shown below:

<u>Column 13,</u>
Line 64, delete "grprp" and insert -- group --.

Signed and Sealed this

Thirtieth Day of May, 2006

JON W. DUDAS
*Director of the United States Patent and Trademark Office*